US008227928B2

(12) United States Patent
Garner et al.

(10) Patent No.: US 8,227,928 B2
(45) Date of Patent: Jul. 24, 2012

(54) THERMO-ELECTRO-ACOUSTIC ENGINE AND METHOD OF USING SAME

(75) Inventors: Sean Garner, Burlingame, CA (US); David Eric Schwartz, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 459 days.

(21) Appl. No.: 12/533,839

(22) Filed: Jul. 31, 2009

(65) Prior Publication Data

US 2011/0025073 A1 Feb. 3, 2011

(51) Int. Cl.
*F02B 63/04* (2006.01)
*F03G 7/08* (2006.01)
*H02K 7/18* (2006.01)
*H01L 41/00* (2006.01)
*H02N 2/00* (2006.01)
*F02G 1/04* (2006.01)

(52) U.S. Cl. ........ 290/1 R; 310/311; 310/328; 310/339; 60/508; 60/721; 62/6

(58) Field of Classification Search ................. 290/1 R; 62/6; 60/508, 721; 310/339, 311, 328
See application file for complete search history.

(56) References Cited

U.S. PATENT DOCUMENTS

| 2,836,033 A * | 5/1958 | Marrison | 60/516 |
|---|---|---|---|
| 3,548,589 A | 12/1970 | Cooke et al. | 60/526 |
| 3,956,894 A * | 5/1976 | Tibbs | 60/508 |
| 4,114,380 A | 9/1978 | Ceperley | 60/721 |
| 4,355,517 A | 10/1982 | Ceperley | 60/721 |
| 4,389,849 A | 6/1983 | Gasser et al. | 62/6 |
| 4,398,398 A | 8/1983 | Wheatley et al. | 62/467 |
| 4,489,553 A | 12/1984 | Wheatley et al. | 60/516 |
| 4,534,176 A | 8/1985 | Horn et al. | 62/6 |
| 4,686,407 A | 8/1987 | Ceperley | 310/323.01 |
| 5,167,124 A | 12/1992 | Lucas | 62/6 |

(Continued)

FOREIGN PATENT DOCUMENTS

EP 10171102 11/1918

(Continued)

OTHER PUBLICATIONS

Radebaugh, R., "Development of the Pulse Tube Refrigerator as an Efficient and Reliable Cryocooler", Proc. Inst of Refrigeration (London 1999-2000).

(Continued)

*Primary Examiner* — Pedro J Cuevas
(74) *Attorney, Agent, or Firm* — Jonathan A. Small

(57) ABSTRACT

A thermo-electro-acoustic engine comprises a sealed body having a regenerator, hot and cold heat exchangers, an acoustic source, and an acoustic energy converter. An acoustic pressure wave is generated in a gas in the region of the regenerator. The converter converts a portion of the acoustic pressure into electrical energy. A portion of the electrical energy is used to drive the acoustic source. The acoustic source is controllably driven to produce acoustic energy which constructively adds to that of the acoustic pressure wave in the region of the regenerator. The remaining electrical energy produced by the converter is used external to the engine, such as to drive a load or for storage. The resonant frequency of the engine and the frequency of the energy output can be controlled electronically or electromechanically, and is not limited solely by the physical structure of the engine body and its elements.

10 Claims, 6 Drawing Sheets

U.S. PATENT DOCUMENTS

| | | | |
|---|---|---|---|
| 5,303,555 A | 4/1994 | Chrysler et al. | 62/6 |
| 5,329,768 A | 7/1994 | Moscrip | 60/518 |
| 5,357,757 A | 10/1994 | Lucas | 62/6 |
| 5,369,625 A | 11/1994 | Gabrielson | 367/140 |
| 5,647,216 A | 7/1997 | Garrett | 62/6 |
| 5,673,561 A | 10/1997 | Moss | 62/6 |
| 6,272,855 B1 * | 8/2001 | Leonardi | 60/513 |
| 6,314,740 B1 | 11/2001 | De Blok et al. | 62/6 |
| 6,385,972 B1 | 5/2002 | Fellows | 60/517 |
| 6,560,970 B1 | 5/2003 | Swift | 62/6 |
| 6,571,552 B2 | 6/2003 | Ban et al. | 60/312 |
| 6,574,968 B1 | 6/2003 | Symko et al. | 62/6 |
| 6,578,364 B2 | 6/2003 | Corey | 62/6 |
| 6,591,610 B2 | 7/2003 | Yazawa et al. | 60/527 |
| 6,604,364 B1 | 8/2003 | Arman et al. | 62/6 |
| 6,644,028 B1 | 11/2003 | Swift et al. | 60/516 |
| 6,658,862 B2 | 12/2003 | Swift et al. | 62/6 |
| 6,688,112 B2 | 2/2004 | Raspet et al. | 62/6 |
| 6,711,905 B2 | 3/2004 | Howard | 62/6 |
| 6,725,670 B2 | 4/2004 | Smith et al. | 62/6 |
| 6,732,515 B1 | 5/2004 | Weiland et al. | 60/520 |
| 6,792,764 B2 | 9/2004 | Poese et al. | 62/6 |
| 6,804,967 B2 | 10/2004 | Symko et al. | 62/6 |
| 6,868,673 B2 | 3/2005 | Weiland et al. | 60/698 |
| 6,910,332 B2 | 6/2005 | Fellows | 60/520 |
| 6,910,335 B2 | 6/2005 | Viteri et al. | 60/786 |
| 7,017,351 B2 | 3/2006 | Hao et al. | 62/6 |
| 7,055,332 B2 | 6/2006 | Poese et al. | 62/6 |
| 7,062,921 B2 | 6/2006 | Jeng et al. | 62/6 |
| 7,081,699 B2 | 7/2006 | Keolian et al. | 310/311 |
| 7,104,055 B2 * | 9/2006 | Matsubara et al. | 60/520 |
| 7,143,586 B2 | 12/2006 | Smith et al. | 62/6 |
| 7,156,487 B2 | 1/2007 | Chou et al. | 347/44 |
| 7,240,495 B2 | 7/2007 | Symko et al. | 62/6 |
| 7,263,837 B2 | 9/2007 | Smith | 62/6 |
| 7,290,771 B2 | 11/2007 | Smith | 277/634 |
| 7,434,409 B2 | 10/2008 | Gedeon | 62/6 |
| 7,772,746 B2 * | 8/2010 | Keolian et al. | 310/339 |
| 7,908,856 B2 * | 3/2011 | Backhaus et al. | 60/517 |
| 2003/0192323 A1 | 10/2003 | Poese et al. | 62/6 |
| 2003/0192324 A1 | 10/2003 | Smith et al. | 62/6 |
| 2003/0226364 A1 | 12/2003 | Swift et al. | 62/6 |
| 2006/0266041 A1 | 11/2006 | Fellows | 60/645 |
| 2006/0266052 A1 | 11/2006 | Hsing et al. | 62/6 |
| 2007/0261839 A1 | 11/2007 | Watanabe et al. | 165/299 |
| 2008/0060364 A1 | 3/2008 | Watanabe et al. | 62/6 |
| 2011/0023500 A1 * | 2/2011 | Garner et al. | 62/6 |
| 2011/0265493 A1 * | 11/2011 | Schwartz et al. | 62/6 |
| 2011/0265505 A1 * | 11/2011 | Schwartz et al. | 62/215 |
| 2012/0017607 A1 * | 1/2012 | Bin-Nun et al. | 62/6 |

FOREIGN PATENT DOCUMENTS

| | | |
|---|---|---|
| EP | 10171103.4 | 10/1919 |
| GB | 1252258 | 3/1971 |
| WO | WO 2005/022606 A2 | 10/2005 |
| WO | 2008036920 A2 | 3/2008 |
| WO | 2009124132 A1 | 10/2009 |

OTHER PUBLICATIONS

Rossing, T. D. (Ed.), "Springer Handbook of Acoustics", Ch. 7, pp. 239-255 (Springer 2007).

Physorg.com, "A sound way to turn heat into electricity", 3 pages (Jun. 4, 2007).

Swift, G.W., et al., "Acoustic recovery of lost power in pulse tube refrigerators", J. Accoust. Soc. Am. (2), pt. 1, pp. 711-724 (Feb. 1999).

* cited by examiner

THERMO-ELECTRO-ACOUSTIC ENGINE AND METHOD OF USING SAME

BACKGROUND

The present disclosure is related to thermoacoustic devices, and more specifically to a thermoacoustic device employing an acoustic energy converter and electrical impedance network in place of selected portions of an acoustic impedance network.

The Stirling cycle is a well-known 4-part thermodynamic process, typically operating on a gas, to produce work, or conversely to effect heating or refrigeration. The 4 parts are: isothermal expansion, isochoric heat extraction, isothermal compression, and isochoric heat addition. The process is closed, in that the gas remains within the system performing the cycle at all times during the cycle.

A number of devices employing the Stirling cycle are generically referred to as Stirling engines. A typical Stirling engine has a mechanical piston (often two pistons), which responds to the heating/expansion and cooling/contraction of a contained gas as part of the Stirling cycle. The motion of the piston(s) drives a crank from which work can be extracted. An element, typically called a regenerative heat exchanger or regenerator, increases the engine's thermal efficiency. Stirling engines often include a piston and other related moving parts. Devices of this type are often complex, involve seals and pistons, and require regular maintenance.

Thermoacoustic engines are another group of devices utilizing a Stirling thermodynamic cycle. These devices share some fundamental physical properties with Stirling engines, namely a contained gas which approximates a Stirling cycle. However, a thermoacoustic engine differs from a Stirling engine in that a temperature differential amplifies acoustic energy which is extracted for work. Often, there are no pistons or cranks such as typically found in a Stirling engine.

FIG. 5 is a cross-sectional representation of one example 30 of known thermoacoustic engine designs. One embodiment of a thermoacoustic engine known in the art is a hollow, looped, sealed body structure 32 having a regenerator 34 located therein. The regenerator is often simply a metal mesh or matrix. The regenerator is proximate a first heat exchanger 36, generally a "cold" exchanger, at a first end thereof and a second heat exchanger 38, generally a "hot" exchanger, at the opposite end thereof. A third heat exchanger, generally at ambient temperature, may optionally be present. A resonator 40, often in the form of an extension of the hollow body structure is provided. The body structure is filled with a pressurized gas. The temperature differential across the regenerator, i.e., between the hot and cold heat exchangers, subjects the gas to localized heat transfer. Acoustic energy in the form of a pressure wave in the region of the regenerator subjects the gas to local periodic compression and expansion. Under favorable acoustic conditions, the gas effectively undergoes an approximate Stirling cycle in the regenerator.

If the acoustic impedance at the regenerator is low, the pressure oscillations associated with the sound waves are associated with large fluidic displacement velocities. This results in large fluidic resistance losses which degrade the efficiency of the device. Therefore, it is desirable to have a large acoustic impedance at the regenerator. Current thermoacoustic heat engines use an acoustic resonator and/or an acoustic feedback network to achieve this large impedance.

Thus, the body structure and resonator form a physical acoustic impedance network such that the pressure wave travels across the regenerator and resonantly feeds back within the body structure. Due to this feedback and the thermal gradient between heat exchangers, the working gas undergoes a Stirling cycle and does work external to the engine. For example, a transducer 42 may be disposed within the body structure or resonator, and a portion of the energy of the pressure wave may be converted to electrical energy by the transducer.

Unlike conventional Stirling engines, most thermoacoustic engines have few if any mechanical moving parts and are therefore very reliable. Furthermore, unlike conventional Stirling engines, the gas within a thermoacoustic engine does not travel significantly within the body structure. Rather, the pressure wave propagates through the gas and the Stirling cycle takes place locally inside the regenerator. Thermoacoustic engines may operate with either primarily traveling- or standing-wave phasing of the acoustic wave in the regenerator. Standing-wave devices are known to be less efficient than traveling-wave devices.

There are numerous other examples of thermoacoustic engines known in the art. U.S. Pat. No. 7,143,586 to Smith et al., U.S. Pat. No. 7,081,699 to Keolian et al., and U.S. Pat. No. 6,578,364 to Corey illustrate several examples, respectively. Each of these US Patents is incorporated herein by reference. However, each of these examples presents its own set of disadvantages. One disadvantage of certain prior art devices is their relatively large size, primarily due to the necessary length of the resonant acoustic impedance network. This size is a disadvantage for many applications, where a compact device is required. And, the topology and/or the relatively large volume of the body results in an increase in acoustic, thermal, and, in some cases, mass-streaming losses. Another disadvantage is that while pistons sealed within cylinders, and crank arms do not always form a part of known thermoacoustic engines, a number of other elements such as drivers for driving motion of portions of the engine body, bellows, and other moving parts (excluding transducers) are present in prior art engines, adding complexity, size, weight, and cost, increasing the number of elements susceptible to failure, and increasing acoustic loss within the system. A still further disadvantage is that the operating frequency of the engine is set by the physical dimensions of the body and resonator, the construction of the regenerator, and the gas used within the body. It cannot be chosen based, for example, on the desire for improved heat transfer at lower frequencies, matching the frequency of the load, etc.

SUMMARY

Accordingly, the present disclosure is directed to a simple, compact, and lightweight traveling-wave thermoacoustic engine. One characteristic of the engine disclosed herein is that the acoustic body structure forming the engine does not require a resonator. Another characteristic is that the engine's only moving parts are the mechanical elements of the acoustic source and converter chosen to form a part of the thermoacoustic engine disclosed herein.

The engine consists of a body housing a regenerator, two heat exchangers with one on each side of the regenerator, two electroacoustic transducers with one on each end of the body opposite one another relative to the regenerator, and an external electrical network which serves to control the motion of the two transducers, and to couple useful energy to an electrical load. The engine may also contain a third heat exchanger separated from the hot heat exchanger by a length of tube.

According to one aspect of the disclosure, acoustic energy produced by the thermoacoustic engine is converted by one of the electroacoustic transducers the "acoustic energy converter," to electric energy. A portion of the electric energy is output for the purpose of performing work or alternatively is stored. The remaining electrical energy output is fed back to the other electroacoustic transducer, the "acoustic source", to further drive the cycle of energy production in the engine.

According to this aspect, an electrical impedance network replaces the acoustic impedance network, effectively obviating the need for the resonator portion within the thermoacoustic engine. The electrical impedance network may take a variety of forms, and be comprised of a variety of passive and/or active elements. For this reason, the device disclosed herein is referred to as a thermo-electro-acoustic engine.

The acoustic source drives a pressure wave within a closed body structure containing a gas. The closed body structure further contains a regenerator, and first and second heat exchangers, through which the pressure wave may travel. A thermal gradient is established between the first and second heat exchangers. The thermal gradient amplifies the acoustic energy in the regenerator. Located opposite the acoustic source relative to the regenerator is an acoustic energy converter, which converts the amplified pressure wave to an electrical signal. The third heat exchanger, if present, serves to control the temperature of the gas at a distance from the hot heat exchanger.

Accordingly, a portion of the electrical energy provided by the converter is output from the engine, for example to drive a load or for storage. The balance of the electrical energy to be fed back to the acoustic source is subjected to an appropriate phase delay and impedance such that it is in phase and of a desired amplitude to result in constructive feedback. The electrical network, in combination with the electroacoustic transducers and acoustic elements, thus sets the acoustic impedance in the region of the regenerator, and the frequency of the electrical energy provided for useful work outside of the engine without need for inverters or other elements to perform frequency conversion.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

Figure 1:
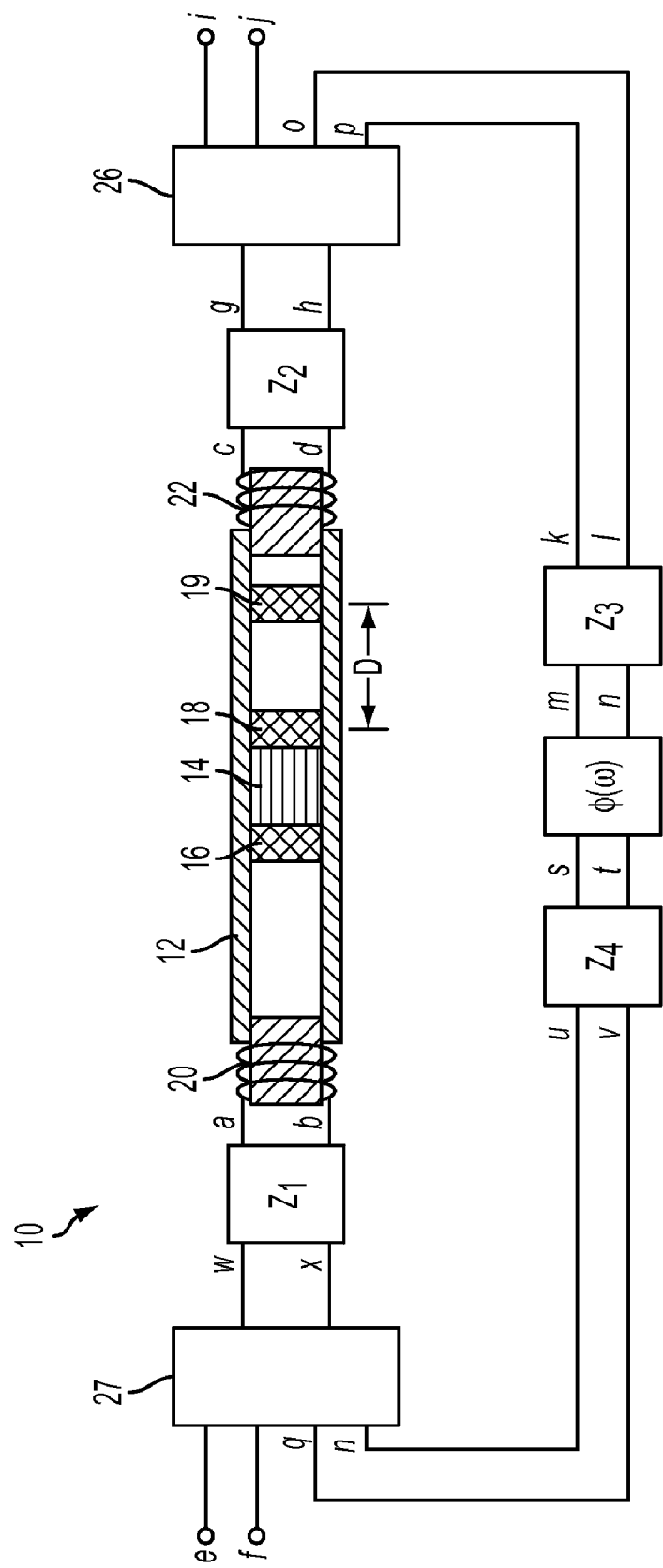
FIG. 1 is a schematic illustration of a first embodiment of a thermo-electro-acoustic engine according to the present disclosure.

With reference to FIG. 1, there is shown therein a first embodiment 10 of a thermo-electro-acoustic engine according to the present disclosure. Engine 10 comprises a generally tubular body 12. The material from which body 12 is constructed may vary depending upon the application of the present invention. However, body 12 should generally be thermally and acoustically insulative, and capable of withstanding pressurization to at least several atmospheres. Exemplary materials for body 12 include stainless steel or an iron-nickel-chromium alloy.

Disposed within body 12 is regenerator 14. Regenerator 14 may be constructed of any of a wide variety of materials and structural arrangements which provide a relatively high thermal mass and high surface area of interaction with the gas but low acoustic attenuation. A wire mesh or screen, open-cell material, random fiber mesh or screen, or other material and arrangement as will be understood by one skilled in the art may be employed. The density of the material comprising regenerator 14 may be constant, or may vary along its longitudinal axis such that the area of interaction between the gas and wall, and the acoustic impedance, across the longitudinal dimension of regenerator 14 may be tailored for optimal efficiency. Details of regenerator design are otherwise known in the art and are therefore not further discussed herein.

Adjacent each lateral end of regenerator 14 are first and second heat exchangers 16, 18, respectively. Heat exchangers 16, 18 may be constructed of any of a wide variety of materials and structural arrangements which provide a relatively high efficiency of heat transfer from within body 12 to a transfer medium. In one embodiment, heat exchangers 16, 18 may be one or more tubes (not shown) for carrying therein a fluid to be heated or cooled. The tubes are formed of a material and sized and positioned to efficiently transfer thermal energy (heating or cooling) between the fluid therein and the gas within body 12 during operation of the engine. To enhance heat transfer, the surface area of the tubes may be increased with fins or other structures as is well known in the art. Details of heat exchanger design are otherwise known in the art and are therefore not further discussed herein.

Optionally, a third heat exchanger 19 may be disposed within one end of body 12, for example such that heat exchanger 18 is located between third heat exchanger 19 and regenerator 14. Third heat exchanger 19 may be of a similar construction to first and second heat exchangers 16, 18 such as one or more tubes (not shown) formed of a material and sized and positioned to efficiently transfer thermal energy (heating or cooling) between a fluid therein and the gas within body 12 during operation of the engine.

An acoustic source 20 is disposed at a first longitudinal end of body 12, and an acoustic converter 22 is disposed at a second longitudinal end of body 12 opposite to said acoustic source 20 relative to said regenerator 14. Many different types of devices may serve the function of acoustic source 20. A well-known moving coil, piezo-electric, electro-static, ribbon or other form of loud speaker may form acoustic source 20. A very efficient, compact, low-moving-mass, frequency tunable, and frequency stable speaker design is preferred so that the energy output from the engine may be maximized.

Likewise, many different types of devices may serve the function of acoustic converter 22. A well-known electrostatic, electromagnetic, piezo-electric or other form of microphone or pressure transducer may form acoustic converter 22. In addition, gas-spring, compliance elements, inertance elements, or other acoustic elements, may also be employed to enhance the function of converter 22. Again, efficiency is a preferred attribute of acoustic converter 22 so that the energy output from the engine may be maximized.

Figure 2:
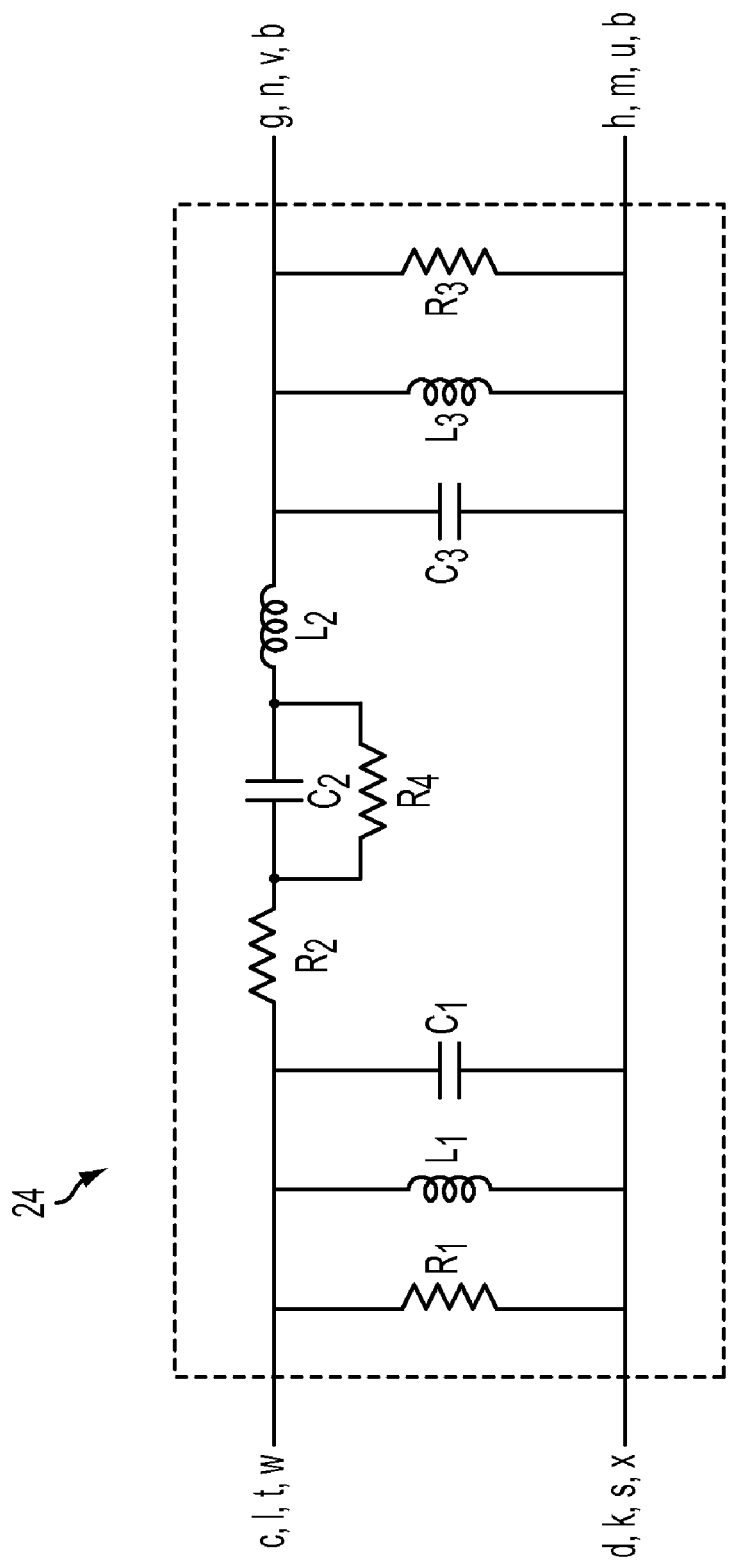
FIG. 2 is a schematic illustration of an impedance circuit for use in thermo-electro-acoustic engine of FIG. 1.
Figure 3A:
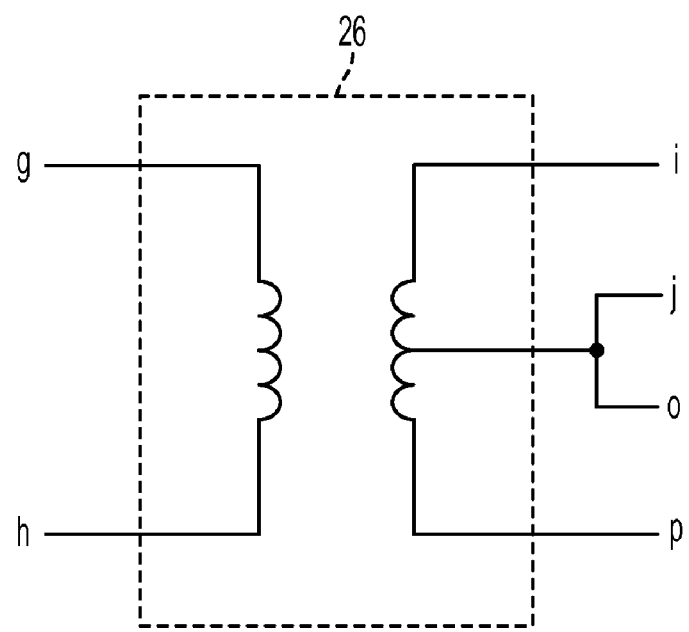
FIGS. 3A and 3B are a schematic illustrations of a power splitter and power combiner, respectively, for use in thermo-electro-acoustic engine of FIG. 1.
Figure 3B:
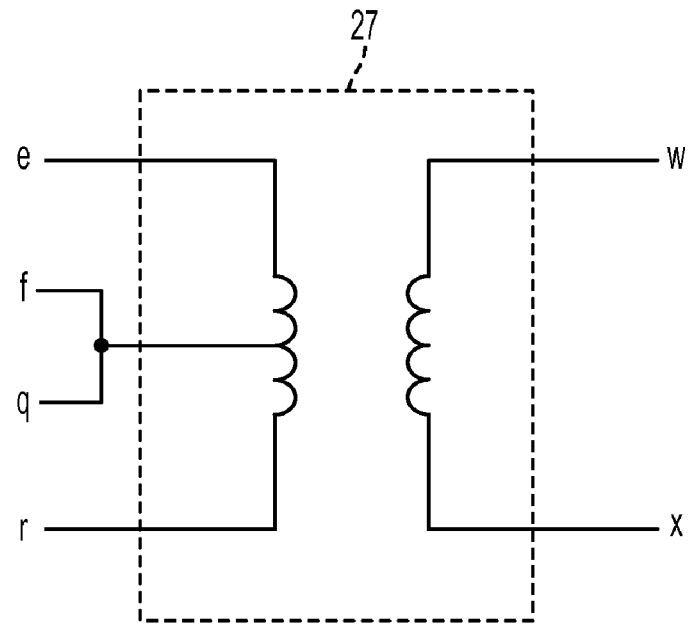

The input a, b to acoustic source 20 is from a impedance circuit $Z_1$. Outputs c, d, from acoustic converter 22 are provided to a impedance circuit $Z_2$. The output g, h of impedance circuit $Z_2$ is provided to a splitter 26 (one example shown in FIG. 3A). A portion o, p of the output of splitter 26 is provided to impedance circuit $Z_3$. The output of impedance circuit $Z_3$ is input to a phase delay circuit $\phi(\omega)$, employed to achieve desired phasing as is well understood in the art. The output of phase delay circuit $\phi(\omega)$ is input to impedance circuit $Z_4$, the output of which is input to a combiner 27 (shown in FIG. 3B), and ultimately fed back to impedance circuit $Z_1$ as inputs w, x. The roles of impedance circuits $Z_1$, $Z_2$, $Z_3$, and $Z_4$ are to match the system impedances and drive acoustic source 20 at a desired frequency and phase. Each impedance circuit $Z_1$, $Z_2$, $Z_3$, and $Z_4$ may for example be a circuit such as circuit 24 illustrated in FIG. 2. Frequency selection is discussed further below. In addition, combiner 27 may be provided with an external input e, f used for example for grid frequency- and phase-locking, to speed up start-up, etc.

Figure 4:
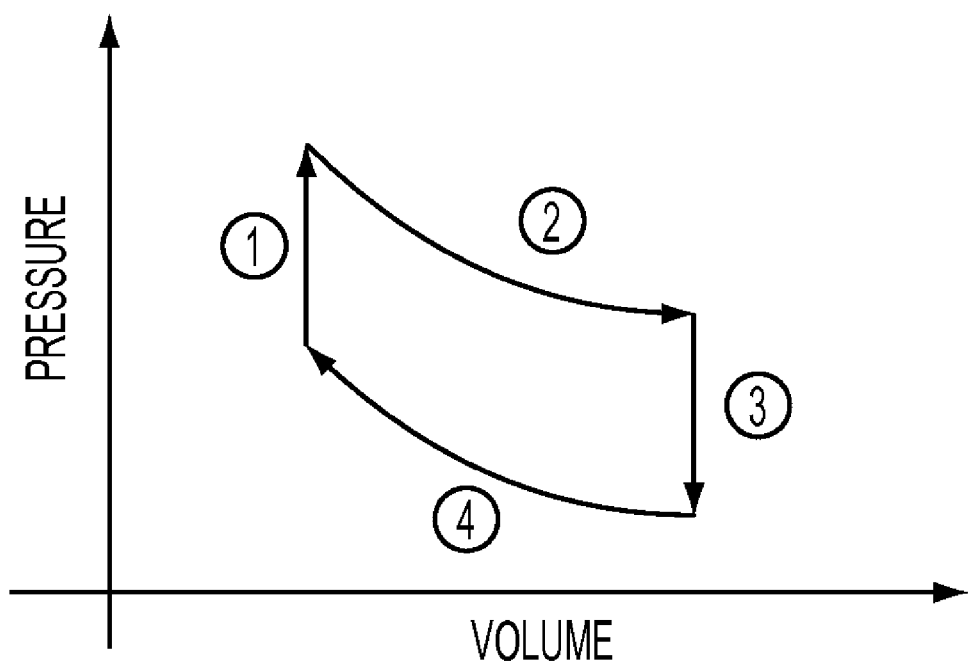
FIG. 4 is a graph of pressure versus volume illustrating the Stirling cycle as approximated by the gas in the regenerator of the thermo-electro-acoustic engine of FIG. 1.
Figure 5:
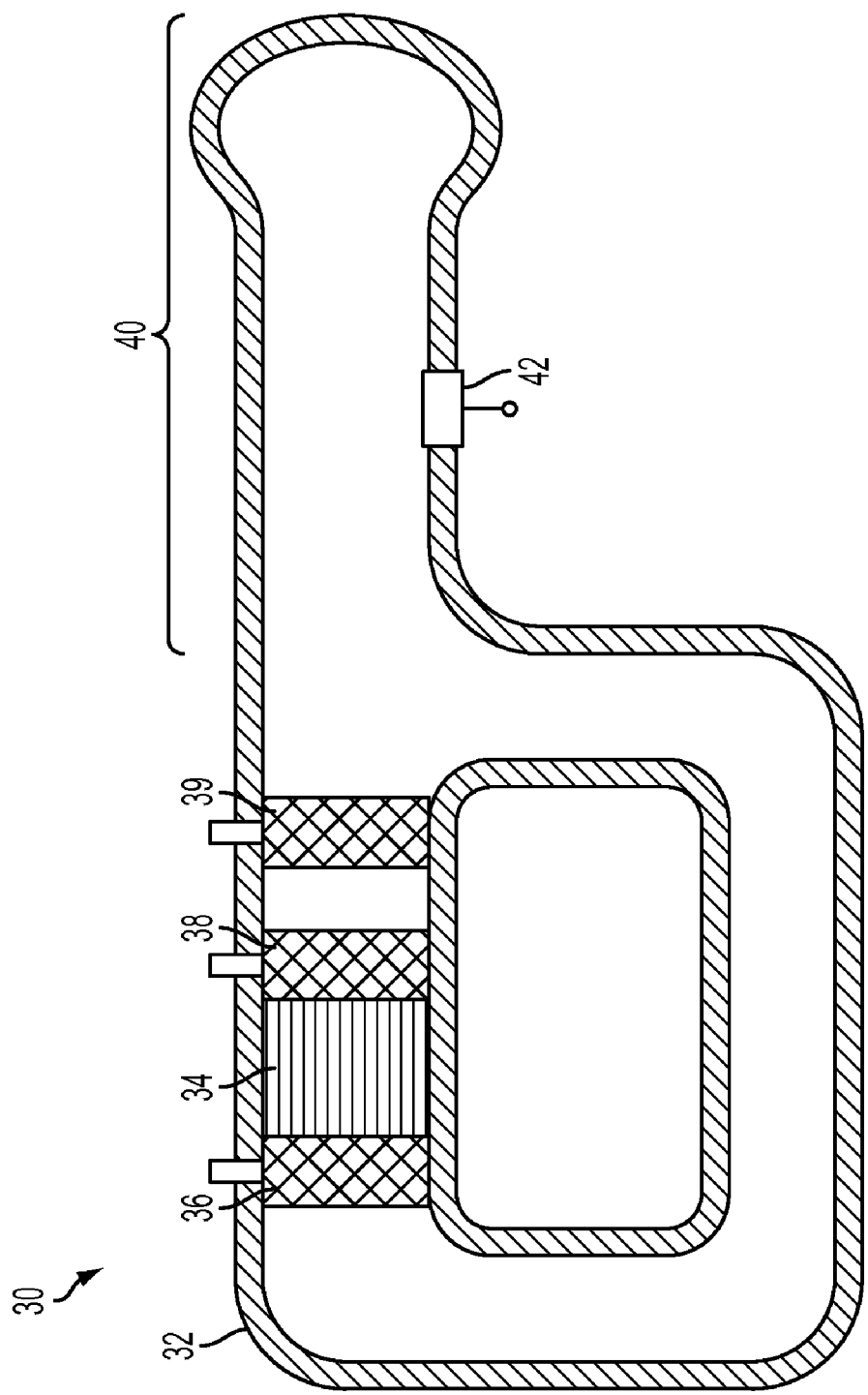
FIG. 5 is an illustration of a thermoacoustic engine of a type known in the art.

With the basic physical elements and their interconnections described above, we now turn to the operation of engine 10. Initially, a gas, such as helium, is sealed within body 12. A temperature gradient is established in regenerator 14 by establishing first heat exchanger 16 as a "cold" heat exchanger and second heat exchanger 18 as a "hot" heat exchanger. With proper choice of the dimensions and material choices for body 12 and regenerator 14, of the gas, and of the temperatures of the cold and hot heat exchangers, when the gas undergoes acoustic oscillations, an approximate Stirling cycle is initiated in the region of the regenerator. This cycle, illustrated in FIG. 4, comprises a constant-volume heating of the gas as it moves in the direction from the cold heat exchanger to the hot heat exchanger at stage 1, isothermal expansion of the gas at stage 2, constant-volume cooling of the gas as it moves in the direction from the hot heat exchanger to the cold heat exchanger at stage 3, and consequent isothermal contraction of the gas at stage 4, at which point the gas heats again and the process repeats itself. In this way the acoustic oscillations in the regenerator 14 are amplified. Regenerator 14 serves to store heat energy and greatly improves the efficiency of energy conversion.

The acoustic source 20 produces an acoustic wave which is amplified in the regenerator 14 in the manner described above. The amplified acoustic energy is incident on converter 22, which converts a portion of that energy into electric energy. A portion of this electric energy is fed back to and drives acoustic source 20. The values of the electrical components (e.g., $R_{1-4}$, $L_{1-3}$, and $C_{1-3}$) are chosen such that in conjunction with the mechanical and acoustic components, positive feedback is established to maintain the oscillations. As acoustic energy is amplified in this process, converter 22 is therefore able to produce an increased amount of electrical energy, a part of which goes to further driving acoustic source 20, and the remainder of which goes to driving the load, storage, etc.

As mentioned, a large portion of the volume and length of prior art thermoacoustic engines forms the acoustic network. Thus, replacing the acoustic network with an electrical network permits the formation of a more compact engine, for which there are numerous advantages such as use in more confined and size- and weight-limited applications, increased efficiency due to reduced viscous and thermal relaxation losses, etc. Engines of the type disclosed herein exhibit fewer acoustic losses because of the reduced size and reduction of streaming as compared to the prior art. Furthermore, by replacing part of the physical acoustic network with a tunable electric network the operational frequency of the device is no longer defined by the engine structure, but may instead be independently chosen. This allows lower frequencies to be used, which, as they admit better heat transfer to and from the regenerator as compared to higher frequencies, provide a higher efficiency. Typically, a particular device is designed for a specific frequency. Electrical tuning may optimize the operation of the engine, enable frequency-locking to the grid, etc. However, a particular device can be designed for a large range of frequencies without requiring a change to the acoustical portion of the device. Still further, this allows electrical energy to be generated at the frequency of the load, such as an electrical grid, obviating the need for inverters and other elements used for frequency conversion. Further still, the electrical components can be more easily tuned than acoustic elements, facilitating optimization of the device.

Figure 6:
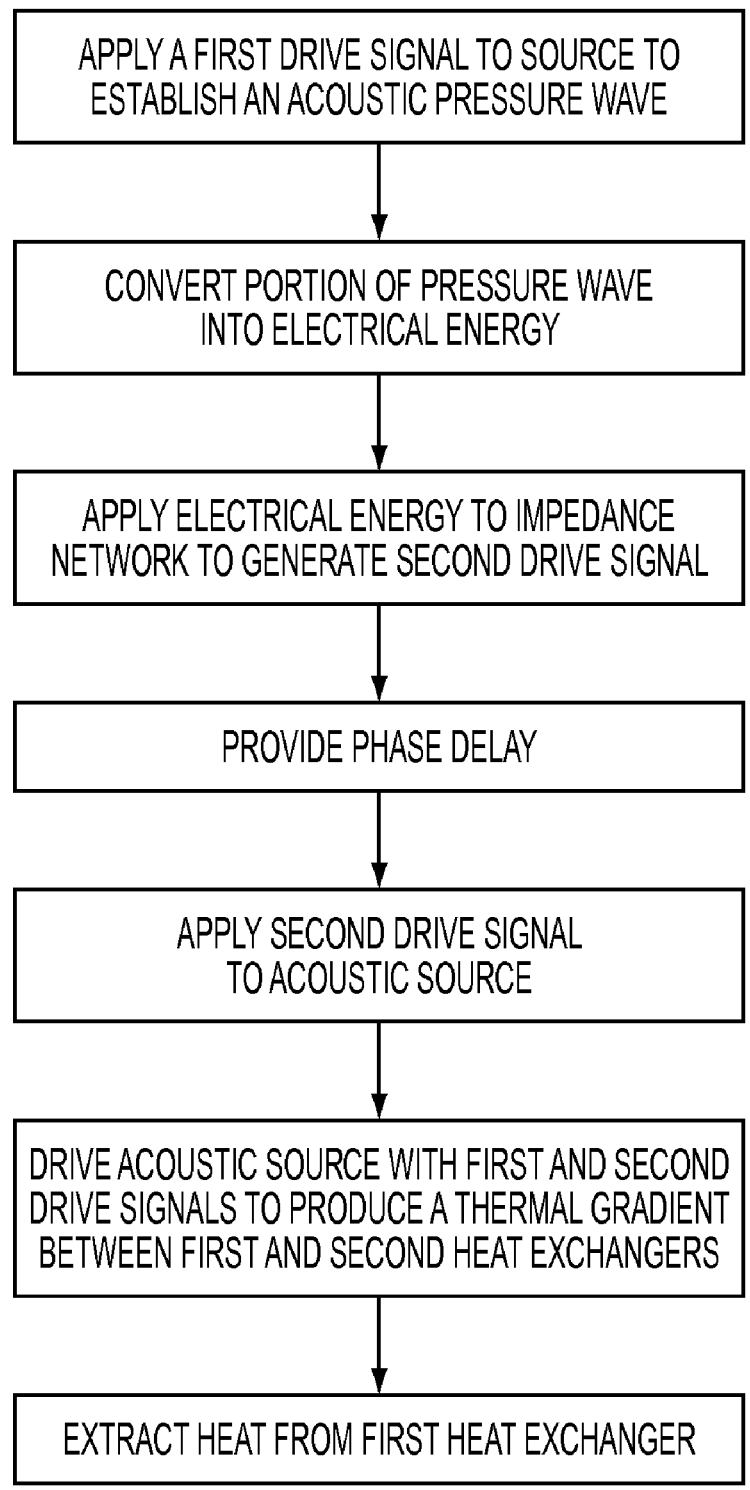
FIG. 6 is a flow chart illustrating method of operating a thermo-electro-acoustic refrigerator according to an embodiment of the present disclosure.

With reference to FIG. 6, a method of operating a thermo-electro-acoustic refrigerator pursuant to the above description of an embodiment of the present disclosure is shown.

No limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example, while the above description is in terms of a tubular structure with coaxially arranged elements, other physical arrangements may be advantageous for one application or another, such as a curved or folded body, locating either or both source and transceiver non-coaxially (e.g., on a side as opposed to end of the body), and are contemplated by the present description and claims, below. Thus, various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A thermo-electro-acoustic refrigerator, comprising:
   a generally hollow body having first and second open ends, said body containing a working gas;
   a regenerator disposed within said body;
   a first heat exchanger disposed within said body and proximate said regenerator at a first longitudinal end thereof;

a second heat exchanger disposed within said body and
proximate said regenerator at a second longitudinal end
thereof;
an acoustic source coupled to said first end of said body
such that acoustic energy from said acoustic source is
directed into said body;
a driver communicatively connected to said acoustic
source for providing a first driving signal to said acoustic
source;
an acoustic energy converter coupled to said second end of
said body opposite said first end relative to said regenerator such that at least a portion of the acoustic energy
within said body is converted by said converter into
electrical energy;
said converter electrically coupled to said acoustic source
such that at least a portion of electrical energy produced
by said converter is provided to and drives said acoustic
source as a second driving signal;
impedance matching circuitry disposed between and in
electrical communication with said converter and said
acoustic source such that electrical energy provided by
said converter is coupled to said acoustic source; and
a phase delay device disposed between and in electrical
communication with either said converter and said
impedance matching circuitry or said impedance matching circuitry and said acoustic source such that the phase
of the electrical energy can be controlled to provide a
controlled phase relationship between the first and second driving signals;
whereby said acoustic energy operates on the gas in the
region of the regenerator to produce a thermal gradient
which adds heat to said first heat exchanger and extracts
heat from said second heat exchanger.

2. The thermo-electro-acoustic refrigerator of claim 1, wherein said converter and source are electromagnetic transducers.

3. The thermo-electro-acoustic refrigerator of claim 1, wherein said converter and source are piezoelectric transducers.

4. The thermo-electro-acoustic refrigerator of claim 1, further comprising a third heat exchanger disposed within said body and between said second heat exchanger and said acoustic energy converter.

5. A method of operating a thermo-electro-acoustic refrigerator comprising:
applying a first drive signal to an acoustic source acoustically coupled to a body, said body having disposed
therein a regenerator, first and second heat exchangers
on opposite sides of said regenerator, and a pressurized
gas, said acoustic source thereby establishing an acoustic pressure wave in the region of said regenerator;
converting, using an acoustic converter, a portion of said
pressure wave into electrical energy;
selecting an appropriate electrical impedance network
such that said portion of said acoustic energy converted
into electrical energy can be optimally used as a second
drive signal to the acoustic source;
providing a phase delay, by way of a phase delay device,
such that the phase of the electrical energy can be controlled to provide a controlled phase relationship
between the first and second driving signals;
providing the second drive signal to the acoustic source for
use thereby in the generation of an acoustic signal of a
desired frequency; and
driving the acoustic source with said first and second drive
signals such that said acoustic pressure wave produced
thereby establishes a thermal gradient between said first
and second heat exchangers;
whereby, the thermal gradient results in an extraction of
heat from said first heat exchanger.

6. The method of claim 5, further comprising controllably adjusting the phase of the electrical energy obtained from the conversion of the portion of the pressure wave such that the phase of the second drive signal matches the phase of the first drive signal.

7. A system which utilizes a thermo-electro-acoustic engine to provide electrical input to a thermo-electro-acoustic refrigerator, comprising:
a thermo-electro-acoustic engine portion, comprising:
a generally hollow body having first and second open
ends, said body containing a working gas;
a regenerator disposed within said body;
a first heat exchanger disposed within said body and
proximate said regenerator at a first longitudinal end
thereof;
a second heat exchanger disposed within said body and
proximate said regenerator at a second longitudinal
end thereof;
an acoustic source coupled to said first end of said body
such that acoustic energy from said acoustic source is
directed into said body;
an acoustic energy converter coupled to said second end
of said body opposite said first end relative to said
regenerator such that a portion of said acoustic energy
within said body is directed to said converter and
converted thereby into electrical energy;
a thermo-electro-acoustic refrigerator portion, comprising:
a generally hollow body having first and second open
ends, said body containing a working gas;
a regenerator disposed within said body;
a first heat exchanger disposed within said body and
proximate said regenerator at a first longitudinal end
thereof;
a second heat exchanger disposed within said body and
proximate said regenerator at a second longitudinal
end thereof;
an acoustic source coupled to said first end of said body
such that acoustic energy from said acoustic source is
directed into said body;
an acoustic energy converter coupled to said second end
of said body opposite said first end relative to said
regenerator such that at least a portion of the acoustic
energy within said body is converted by said converter
into electrical energy;
impedance matching circuitry disposed between and in
electrical communication with said converter and said
acoustic source such that electrical energy provided by
said converter is coupled to said acoustic source;
a phase delay device disposed between and in electrical
communication with either said converter and said
impedance matching circuitry or said impedance matching circuitry and said acoustic source such that the phase
of the electrical energy can be controlled to provide a
controlled phase relationship between the first and second driving signals; and
said thermo-electro-acoustic engine portion and said
thermo-electro-acoustic refrigerator portion communicatively coupled such that at least a portion of said electrical energy produced by said converter of said thermo-electro-acoustic engine portion is provided as an input to
and drives said acoustic source of said thermo-electro-acoustic refrigerator portion.

8. The system of claim 7, further arranged such that at least a portion of said electrical energy produced by said converter of said thermo-electro-acoustic refrigerator portion is provided as an input to and drives said acoustic source of said thermo-electro-acoustic engine portion.

9. The system of claim 7, further comprising:
a first impedance and phase delay circuit electrically coupled to said converter of said thermo-electro-acoustic engine portion such that at least a portion of electrical energy produced by said converter of said thermo-electro-acoustic engine portion is conditioned to have a desired frequency and phase; and
a splitter electrically coupled to said first impedance circuit, said splitter comprising first output terminals such that a portion of electrical energy produced by said converter of said thermo-electro-acoustic engine portion may be provided to said first output terminals for utilization external to said system, said splitter further comprising second output terminals such that a portion of electrical energy produced by said converter of said thermo-electro-acoustic engine portion may be provided to second output terminals; and
said second output terminals electrically connected to said acoustic source of said thermo-electro-acoustic refrigerator portion such that electrical energy provided by said second output terminals may be input to and drive said acoustic source of said thermo-electro-acoustic refrigerator portion.

10. The system of claim 9, further comprising a second impedance and phase delay circuit, disposed between and in electrical communication with output terminals of said converter of said thermo-electro-acoustic refrigerator portion and input terminals of said acoustic source of said thermo-electro-acoustic engine portion, such that said electrical energy provided by said converter of said thermo-electro-acoustic refrigerator portion may be conditioned to have a desired at least one of frequency and phase, and thereafter be input to and drive the acoustic source of said thermo-electro-acoustic engine portion.

* * * * *